United States Patent
Fetzer et al.

(10) Patent No.: US 6,359,830 B1
(45) Date of Patent: Mar. 19, 2002

(54) STORAGE CELL ON INTEGRATED CIRCUIT RESPONSIVE TO PLURAL FREQUENCY CLOCKS

(75) Inventors: Eric S Fetzer, Longmont; Samuel D Naffziger, Ft. Collins, both of CO (US); Preston J Renstrom, Bloomington, MN (US)

(73) Assignees: Hewlett-Packard Company, Palo Alto; Intel Corporation, Santa Clara, both of CA (US)

( * ) Notice: Subject to any disclaimer, the term of this patent is extended or adjusted under 35 U.S.C. 154(b) by 0 days.

(21) Appl. No.: 09/507,327

(22) Filed: Feb. 18, 2000

(51) Int. Cl.$^7$ .................................................. G11C 8/00
(52) U.S. Cl. ........................ 365/233; 365/195; 365/149
(58) Field of Search ................................. 365/233, 194, 365/195, 185.29, 149

(56) References Cited

U.S. PATENT DOCUMENTS 6,240,044 B1 * 5/2001 Akaogi ........................ 365/233

* cited by examiner

Primary Examiner—Vu A. Le

(57) ABSTRACT

An integrated circuit chip responds to clock waves having differing frequencies at different times. The chip includes a semiconductor memory cell having a write enable input terminal responsive to a write enable signal having first and second levels. The cell has a tendency to operate improperly in response to the first level of the write enable signal having an excessively long predetermined duration. A write enable signal source responds to the clock waves so that for clock waves having half cycles of duration less than the predetermined duration the first level of the write enable signal has durations approximately equal to the durations of the half cycles of these clock waves. For clock waves having half cycles of duration greater than the predetermined duration, the first level of the write enable signal has a duration substantially equal to the predetermined duration.

12 Claims, 3 Drawing Sheets

STORAGE CELL ON INTEGRATED CIRCUIT RESPONSIVE TO PLURAL FREQUENCY CLOCKS

FIELD OF INVENTION

The present invention relates generally to integrated circuit write enable signal generating circuitry and methods for driving storage cells which we have found have a tendency to operate improperly if internal feedback in the storage cell turns off for an excessively long period. The invention relates more particularly to driving such cells with a write enable signal having a predetermined level which disables the cell feedback for no longer than a predetermined interval, even though the integrated circuit responds to differing clock frequencies.

BACKGROUND ART

FIG. 1 is a block diagram of a prior art programmable integrated circuit register including N identical storage cells 0, 1 ... i ... (N−1), responsive to clock source 12 having approximately a 50% duty cycle. Clock source 12 drives cells 0, 1 ... i ... (N−1) in parallel directly and via inverting driver 10. Cells 0, 1 ... i ... (N−1) are also respectively responsive to binary output bits 0, 1 ... i ... (N−1) of input signal source 14, write decode source 16 and read decode source 18. A write operation of the bit from source 14 for a particular cell i occurs when write decode source 16 supplies a binary 1 to cell i during the low (ground voltage) half cycle of the inverted clock output of driver 10. The write decode has a positive going transition that initiates the write operation about 100 ps after a positive going transition of clock source 12, for an exemplary 1 GHz clock source. Sources 12 and 16 are synchronized to achieve this result so negative going transitions thereof occur simultaneously. A read operation of the bit which is stored in cell i occurs when read decode source 18 supplies a binary 1 to cell i during the low voltage half cycles of the output of clock source 12 so the read and write operations cannot occur at the same time.

The circuit of cell i, schematically illustrated in FIG. 2, includes a storage cell comprising two back-to-back, regeneratively connected inverters 20 and 22 which selectively have bit i of source 14 written into them. Each of inverters 20 and 22 includes a pair of complementary metal oxide semiconductor (CMOS) field effect transistors (FET) having series connected source drain paths. Inverter 20 is enabled only during the positive half cycle of the output of driver 10 while inverter 22 is enabled whenever the DC power supply terminals 28 and 30 are connected to $+V_{DD}$ and ground. Thereby, bit i from source 14 is stored in cell i at least during the positive voltage half cycles of the output of driver 10. During the low voltage half cycles of the output of driver 10, inverter 20 is disabled and bit i from source 14 can be written into cell i. Such writing occurs if bit i from write decode source 16 has a binary one (positive voltage) value.

To these ends, inverter 20 includes P channel FET 24 and N channel FET 26, having source drain paths connected in series with each other. FETs 24 and 26 are selectively connected between +VDD power supply terminal or rail 28 and ground terminal or rail 30 via the source drain path of N-channel FET 32, having a gate electrode tied to the output of driver 10. FETs 24 and 26 have gate electrodes tied to each other and the output of inverter 22. FETs 24 and 26 have drains tied to each other to form output terminal 33 of inverter 20 which drives the input of inverter 22. Terminal 33 can be considered the storage node of cell i.

Inverter 22 has the same configuration as inverter 20, thus includes complementary FETs 34 and 36. The gate electrodes of FETs 34 and 36 are connected to be driven in parallel by the voltage at terminal 33. The drains of FETs are connected to each other and the gate electrodes of FETs 24 and 26. Terminal 33 is selectively coupled to bit i of input signal source 14 via the source drain path of N-channel FET 38, having a gate electrode responsive to bit i of write decode source 16.

During the half cycle of source 12 while the output of driver 10 is positive, the source drain path of FET 32 is ON, i.e., has a low impedance, to enable inverter 20 so cell i operates in a storage mode. Cell i operates in the storage mode because of the regenerative, positive feedback arrangement of inverters 20 and 22.

To consider the operation of the cell of FIG. 2 during a write operation, i.e., while driver 10 applies a low voltage to FET 32 to disable inverter 20, assume that source 16 has a positive value to turn on FET 38 while source 14 has a positive value. Thereby, cell i stores a binary one voltage substantially equal to $+V_{DD}$ at terminal 33. The high voltage remains at terminal 33 after source 16 turns off FET 38. Similarly, cell i and terminal 33 are at a low substantially ground voltage in response to bit i having a low voltage value while source 16 turns on FET 38. The voltage at terminal 33 remains low after source 16 turns off FET 38. Hence, during the interval while the output of driver 10 is low to turn off FET 32 and disable inverter 20, the voltage at terminal 33 follows the voltage coupled through the source drain path of FET 38.

In response to bit i of write decode source 16 turning on FET 38, which can occur only while FET 32 is off, the voltage at terminal 33 is substantially equal to the voltage bit i of signal source 14 supplies to the source of FET 38. Because FET 32 turns on simultaneously with FET 38 turning off, cell i stores the value of bit i that source 14 supplied to the cell during the write operation.

If bit i of source 14 supplies a positive voltage, representing a binary one, to terminal 33 cell i stores the binary one even when inverter 20 is disabled by the low voltage output of driver 10. This is because the positive voltage at terminal 33 turns on FET 36 and turns off FET 34 to drive FETs 34 and 36 substantially to ground. The ground voltage at the drains of FETs 34 and 36 turns on FET 24, causing $+V_{DD}$ at terminal 28 to be regeneratively supplied to terminal 33.

Writing a zero voltage to terminal 33 does not have a complementary effect because the resulting high voltage at the drains of FETs 34 and 36 turns off FET 24 and turns on FET 26. Since FET 32 is turned off, the drains of FETs 24 and 26 float except for the connection thereof to terminal 33. Hence, if bit i of write decode source 16 is zero when the output of driver 10 is low, the voltage at terminal 33 floats and is influenced significantly by stray charge coupled to terminal 33.

Cell i stores a bit which is read during the half cycle of clock 12 while the output of clock source 12 has a low (i.e., ground) voltage, provided bit i of read decode source 18 has a high value. Thus cell i can be read only while the cell is in the storage mode and cannot be read while the cell is in the write mode. The read circuitry of cell i includes N-channel FETs 40 and 42, and P-channel FET 44. FETs 40–44 have source drain paths series connected between $+V_{DD}$ and ground DC power supply terminals 28 and 30. FETs 40, 42 and 44 have gate electrodes respectively tied to (1) terminal 33, (2) the lead for output bit i of read decode source 18 and (3) the output terminal of clock source 12. The read output terminal 46 of cell i is the common terminal for the drains of complementary transistors 42 and 44.

During a read operation of cell i, the voltage at terminal 46 is the complement of the voltage at terminal 33 because FET 44, when turned on, has a considerably higher source drain impedance than the combined source drain impedance of FETs 40 and 42, when FETs 40 and 42 are turned on. Hence, if the voltage at terminal 33 is high while the low and high outputs of clock source 12 and bit i of source 18 respectively turn on FETs 44 and 42, terminal 46 is pulled down close to the ground potential at terminal 30. If the voltage at terminal 33 is low while clock source 12 and bit i of source 18 are respectively low and high, the high source drain impedance of FET 40 enables the lower source drain impedance of FET 44 to supply the $+V_{DD}$ voltage at terminal 28 to terminal 46.

The cell of FIG. 2 is designed to operate for the normal operating frequency of clock source 12. Thus, FET 32 is designed so it has a metal oxide layer which accumulates a sufficient amount of charge during a small fraction of a low voltage half cycle of source 12 to cause the source drain path of FET 32 to turn on and stay on throughout the low voltage half cycle of source 12. We have found that FET 32 can be designed to perform this function admirably for normal operating frequencies, e.g., 1 GHz, of clock source 12.

However, when the frequency of clock 12 is reduced substantially, e.g., from a normal operating frequency of 1 GHz to a test or sleep frequency of 100 MHz for the integrated circuit including the circuits of FIG. 1, cells of the type illustrated in FIG. 2 have a tendency to malfunction. We have determined that this tendency to malfunction occurs because the charge from the positive input voltage of signal source 14 can accumulate on node 33 even though the source drain path of FET 38 is in a high impedance mode. Since the circuit must operate through a wide range of clock frequencies, it is possible for charge to accumulate on node 33 when the source drain path of FET 32 is in a high impedance mode for a much longer time than in a normal operating mode at 1 GHz. When driver 10 has a low output voltage caused by clock source 12 having a high positive value for an excessive amount of time associated with half cycles of clock 12 that are considerably longer than a 1 GHz half cycle, the high impedance mode of FET 38 and the desired ground voltage on node 33 cannot be restored because of the accumulated charge. Thus, a zero binary value which should be on node 33 is likely to be inadvertently lost, resulting in improper circuit operation and an increase in the probability of cell failure to an unacceptable level.

It is accordingly an object of the invention to provide a new and improved method of and apparatus for driving CMOS integrated circuit storage cells at multiple, significantly different frequencies.

Another object of the invention is to provide a new and improved method of and apparatus for driving CMOS integrated circuit storage cells at multiple, significantly different frequencies, wherein a tendency of the prior art for leakage current to accumulate charge on a node of the cell during low frequency operation is overcome.

An additional object of the invention is to provide a new and improved method of and apparatus for driving CMOS integrated circuit storage cells at multiple, significantly different frequencies, wherein a tendency of the prior art to operate improperly as a result of the circuitry being driven at clock frequencies substantially lower than normal clock frequency operation is overcome.

SUMMARY OF THE INVENTION

In accordance with one aspect of the invention, an integrated circuit chip adapted to be responsive to a source of clock waves having differing frequencies at different times includes a bi-level write enable source that drives a write enable input terminal of a memory cell. The cell has a tendency to operate improperly in response to the write enable source deriving the first level for an excessively long duration. The write enable signal source is constructed to respond to the clock waves so that (a) for first clock waves having half cycles of duration less than a predetermined duration the write enable source derives the first level for durations approximately equal to the durations of the half cycles of the first clock waves and (b) for second clock waves having half cycles of duration greater than the predetermined duration the write enable source derives the first level for durations substantially equal to the predetermined duration. The predetermined duration is less than the excessively long duration.

The cell typically includes first and second inverters connected to each other in a back-to-back regenerative circuit so a storage node is between the first and second inverters. A gate electrode of a FET is responsive to the write enable source. The FET is connected to the first inverter to respectively enable and disable the first inverter in response to the write enable source deriving the first level and a second level. The field effect transistor is coupled with the storage node. Charge has a tendency to accumulate on storage node in response to the first level turning off the FET for a duration about equal to the excessively long duration. The storage node has a tendency to respond to the excessive charge to erroneously change the state of a binary signal voltage stored by the cell. Because the write enable signal has a duration less than the excessively long duration even though half cycles of the clock exceed the excessively long duration, excessive charge is not leaked to the node and the stored binary signal voltage does not erroneously change.

In a preferred embodiment, the write enable source includes a timing circuit having a resistance capacitance time constant and inputs responsive to a replica of the clock waves and the write enable source. Preferably, the timing circuit includes first and second complementary field effect transistors having series connected source drain paths. The first field effect transistor is connected to be responsive to the clock waves so that during a first half cycle of each of the clock waves the first field effect transistor supplies current from a DC power supply terminal to a resistance and capacitance in a time constant circuit. During a second half cycle of each of the clock waves the capacitance is decoupled from the DC power supply terminal. The second field effect transistor is connected to be responsive to the write enable source so that (a) during an initial portion of the second half cycles the second field effect transistor discharges the capacitance at a rate determined by the resistance capacitance time constant and (b) during the second half cycles having durations in excess of the predetermined duration the capacitance remains discharged sufficiently to cause the write enable signal to have the second level.

In the preferred embodiment, the timing circuit includes a logic gate having first input responsive to a replica of the clock wave and a second input responsive to a bi-level signal indicative of the voltage across the capacitance. The logic gate is arranged so that (a) during the clock first half cycles the voltage across the capacitance and the clock waves causes the write enable signal to be at the second level, (b) during an initial portion of the second half cycles, (prior to elapse of the predetermined duration) the voltage across the capacitance and the clock wave cause the write enable signal to be at the first level, and (c) after the second half cycle has elapsed for a time substantially equal to or greater than the predetermined duration the voltage across the capacitance has decreased sufficiently to prevent the gate from passing the clock wave to cause the write enable signal to be at the second level.

A further aspect of the invention relates to a method of operating a cell of a semiconductor memory. The cell of the semiconductor memory operates correctly in response to bi-level write enable signals having a first level with durations less than a predetermined value. The cell has a tendency to operate incorrectly in response to the first level of the write enable signals having durations greater than the predetermined value. The method includes deriving clock waves having half cycles less than the predetermined period during a first interval. During the first interval, the first level of the write enable input signal supplied to the memory cell has durations substantially equal to the period of a half cycle of the clock wave. During a second interval the clock wave has half cycles with durations in excess of the predetermined duration. During the second interval, the first level of the write enable input signal supplied to the memory cell has durations no greater than the predetermined duration.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

As described.

DETAILED DESCRIPTION OF THE DRAWINGS

Figure 3:
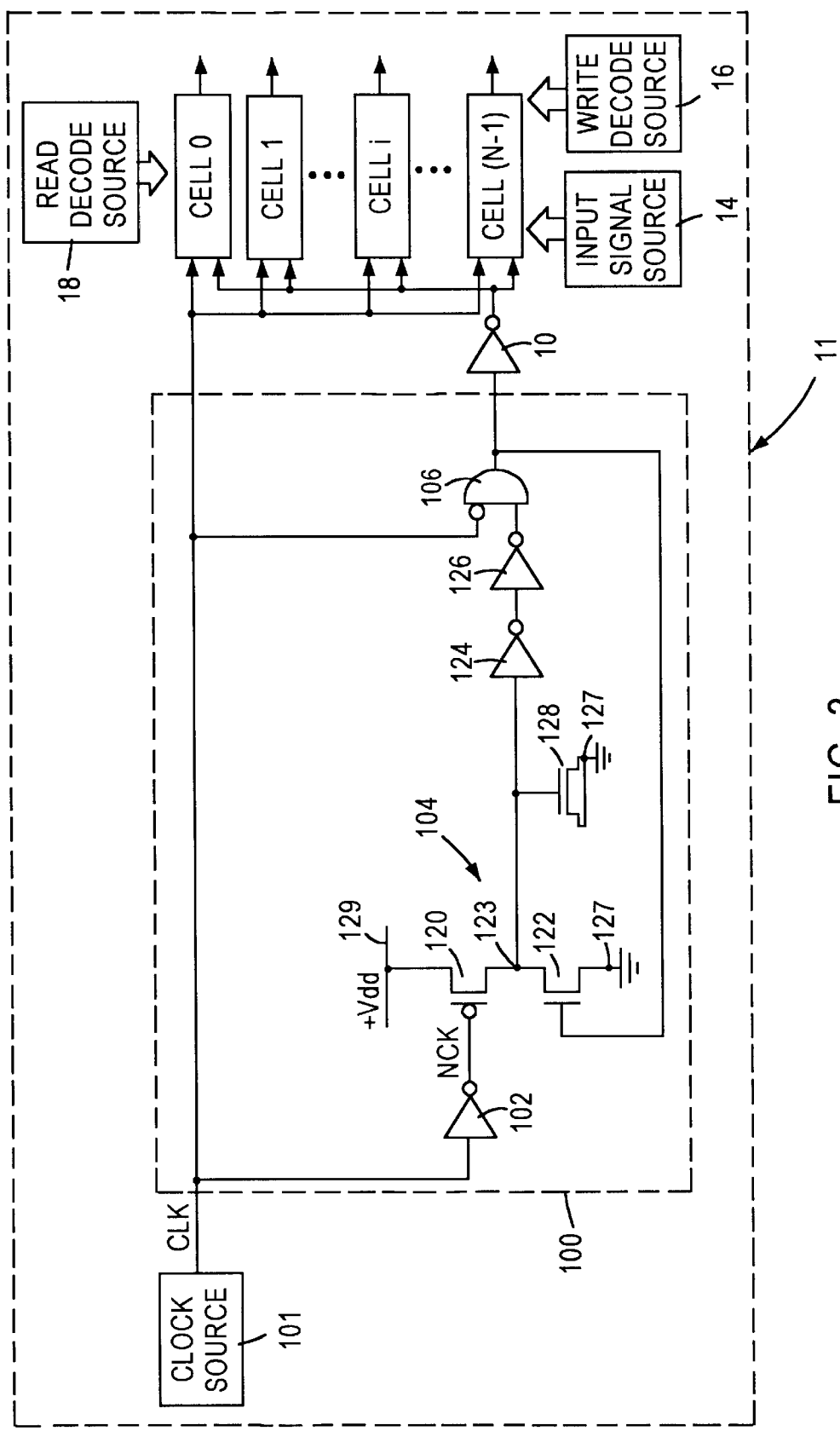
FIG. 3 is a schematic diagram of a preferred embodiment of a write enable circuit in accordance with the present invention wherein the circuit responds to a clock source and drives a register and cell of the type illustrated in FIGS. 1 and 2.

Reference is now made to FIG. 3 of the drawings wherein integrated circuit chip 11 includes complementary metal oxide semiconductor (CMOS) circuitry including millions of P- and N-channel field effect transistors (FET). The only transistors of chip 11 illustrated in FIG. 3 are those necessary to describe the write enable circuit of the preferred embodiment of the present invention. Thus, chip 11 is illustrated in FIG. 3 as including write enable circuit 100 responsive to a CLK square wave output of clock source 101, susceptible of having plural frequencies anywhere in the range between several megahertz and one or more gigahertz (GHz). In one preferred embodiment, the normal operating frequency of source 101 is 1 GHz; however, for test, low power standby or sleep modes, and other purposes, source 101 has a frequency as low a 100 MHz. Source 101 can be a single variable frequency source or plural fixed frequency sources, one of which is switched at a time to an input terminal of write enable circuit 100. Write enable circuit 100 can also be manufactured to be responsive to clocks having a frequency substantially higher than 1 GHz, so that the same fabrication masks which are used to make the 1 GHz integrated circuit of FIG. 3 can be used for integrated circuits responsive to clock sources of several gigahertz.

Write enable circuit 100 responds to frequencies of clock source 101 that are equal to or exceed the normal 1 GHz clock frequency to derive a write enable signal having a high storage mode "enable" voltage having the same duration as the low voltage half cycle portion of clock source 101. If the frequency of clock source 101 is less than 1 GHz, write enable circuit 100 derives a high storage mode enable voltage having a predetermined maximum duration, which is slightly greater than one-half cycle of the normal 1 GHz frequency of clock source 101. In one preferred embodiment, the predetermined duration is 550 picoseconds (ps). Any low voltage half cycle of source 101 that is shorter than 550 ps. causes circuit 100 to derive a write enable signal having a high storage mode enable voltage that is equal in duration to that half cycle. Hence, e.g., if the frequency of source 101 is 100 MHz, write enable circuit 100 derives a high storage mode enable voltage for only 550 ps. during each cycle of source 101; if the frequency of source 101 is 2 GHz, write enable circuit 100 derives a high storage mode enable voltage for about 250 ps. during each cycle of source 101. The 550 ps. maximum duration of the high storage mode enable voltage of the write enable signal prevents excess charge accumulation through the source drain path of FET 38 to node 33 by driving FET 32 into the low impedance mode to enable the storage mode of the memory cells driven by source 101. Consequently, a zero signal voltage previously stored at node 33 remains on the node during the high and low voltage half cycles of clock 101 that are considerably longer than 550 ps.

Figure 1:
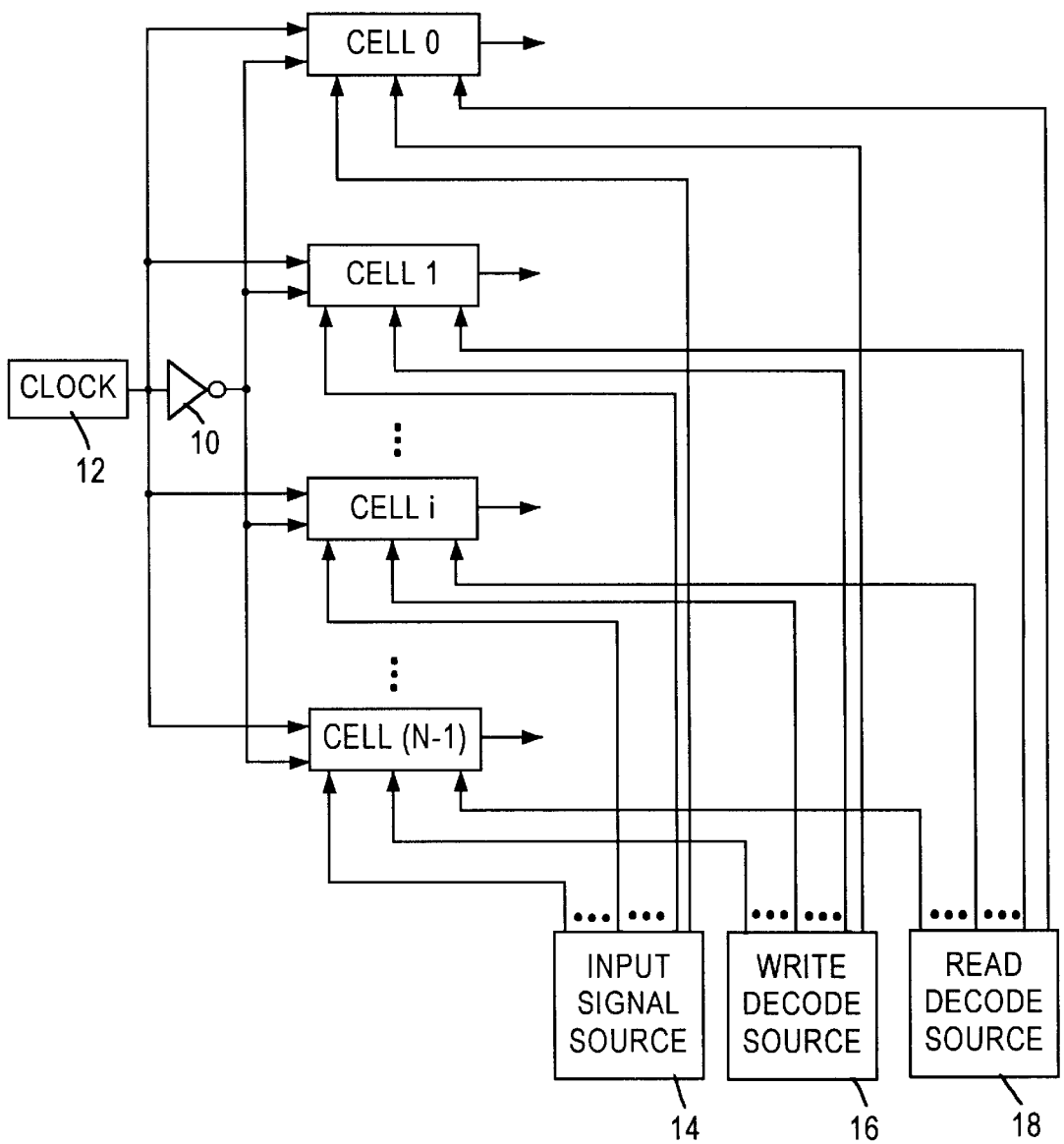
FIG. 1 is a block diagram of a prior art register including N storage cells.

Write enable circuit 100 includes inverter 102, timing circuit 104 and AND gate 106. Inverter 102 responds to the CLK output of clock 101 to derive NCK, an inverted replica of CLK. AND gate 106 has an inverting input terminal responsive to the CLK output of clock 101 and a non-inverting input responsive to the output of timing circuit 104. AND gate 106 derives a write enable signal which is applied via inverting driver 10 in parallel to cells 0, 1 . . . i . . . (N–1) in the same manner that the write enable signal is applied in parallel via driver 10 to cells 0, 1 . . . i . . . (N–1) of FIG. 1. In the circuit of FIG. 3, however, the duration of the high voltage portion of the write enable input to cells 0, 1 . . . i . . . (N–1) is limited to an interval that prevents charge accumulation on node 33 of cells 0, 1 . . . i . . . (N–1) even if the frequency of source 101 is considerably less than the normal operating frequency of the circuitry of chip 11. Timing circuit 100 is also designed so the write enable signal that AND gate 106 derives follows transitions of clock source 101 if adjacent transitions of the CLK occur in less than 550 ps.

To these ends, timing circuit 104 includes an R-C (resistance-capacitance) timing circuit comprising P-channel FET 120, as well as N-channel FETs 122 and 128. FETs 120 and 122 are respectively responsive to the NCK output of inverter 102 and the write enable signal at the output of AND gate 106. Transistors 120 and 122 have series connected source drain paths connected between $+V_{DD}$ terminal 129 and ground terminal 127. FETs 120 and 122 have drains tied to common terminal 123, which is in turn connected to the gate electrode of N-channel FET 128. FET 128, which provides the capacitance component of the RC timing circuit, is connected in a capacitor configuration so its source and drain are connected to ground rail 127. FET 122 is designed to have a high source drain impedance when it is turned on, to provide the resistance component of the RC timing circuit.

Cascaded inverters 124 and 126 respond to the voltage at terminal 123 so that the output of inverter 126 has a steep zero to $+V_{DD}$ transition simultaneously with the voltage at terminal 123 exceeding a threshold of inverter 124.

Typically, the threshold of inverter 124 is about one-half of the +$V_{DD}$ voltage. Inverters 124 and 126 thus are detectors for the voltage level at terminal 123. In response to the voltage at terminal 123 being at the ground and +$V_{DD}$ voltages of rails 127 and 129 inverter 124 derives high and ground voltages, while inverter 126 derives ground and low voltages. In response to the voltage at terminal 123 varying through the threshold of inverter 124, the outputs of inverters 124 and 126 change so inverters 124 and 126 respectively derive output voltages of +$V_{DD}$ and ground as the voltage at terminal 123 goes below the threshold. For a normal 1 GHz operating frequency of clock 101, the voltage at terminal 123 drops below the threshold 550 ps. after a negative going transition of clock 101.

The operation of write enable circuit 100 in response to the output of clock source 101 is as follows. Whenever clock source 101 derives a positive voltage, gate 106 derives a low (ground) voltage. Hence, gate 106 derives the ground voltage throughout the positive half cycle of clock source 101, regardless of the value of the enable output signal of timing circuit 104 and the frequency of clock source 101. This is because the positive output voltage of clock source 101 is essentially inverted by the complementary (i.e., inverting) input terminal of AND gate 106.

Timing circuit 104 derives a positive output voltage during the entire high voltage half cycle of time clock source 101. This is because inverter 102 responds to the positive output voltage of source 101 to supply the gate electrode of FET 120 with a ground voltage that turns on the source drain path of FET 120. Simultaneously, the ground voltage at the output of gate 106 turns off FET 122 by virtue of the connection between the output terminal of gate 106 and the gate electrode of FET 122. Consequently, a low impedance charging path exists through the source drain path of FET 120 to terminal 123 and terminal 123 is decoupled from ground because the low voltage output signal of gate 106 turns off FET 122. Thus, the capacitance of FET 128 is charged through the source drain path of FET 120 to a voltage substantially equal to the positive DC power supply voltage +$V_{DD}$ rail 129. Because of the cascaded connections of inverters 124 and 126, the enable output signal of timing circuit 104, at the output of inverter 126, is substantially at +$V_{DD}$ throughout the high voltage half cycle of clock source 101, regardless of the frequency and duration of clock source 101.

In response to a negative going transition of clock source 101 from a positive voltage to ground, the output signal of gate 106 switches from a low, ground voltage level to a positive voltage level. This is because the complementary input terminal of gate 106 inverts the ground voltage of clock source 101 to a positive voltage and because of the charge storage effects of the capacitance of element 128. In particular, the positive charge and voltage stored by the capacitance of element 128 maintains the voltage at terminal 123 and the enable output of inverter 126 at a high level immediately after the negative going transition of clock source 101 occurs. The high level persists for a period determined by the resistance capacitance (RC) time constant of the impedance shunting terminal 123, i.e., the capacitance of FET 128 and the source drain resistance of FET 122 when FET 122 is on. The low level of CLK and the high level of the enable output of inverter 126 cause AND gate 106 to derive a positive output voltage.

The negative going transition and the subsequent ground output voltage of clock source 101 which occurs during the low voltage half cycle of the clock source cause inverter 102 to apply a positive voltage to the gate electrode of FET 120.

Consequently, FET 120 is cut off, preventing current flow from positive power supply rail 129 through the source drain path of FET 120 to the capacitance of element 128. Substantially simultaneously with the negative going transition of clock 101, the output terminal of gate 106 becomes a positive voltage (as described previously) to turn on FET 122. Consequently, the charge on the capacitance of element 128 discharges through the source drain path of FET 122. The capacitance of element 128 and source drain resistance of FET 122, when FET 122 is on, essentially determine the discharge rate of the charge stored on the capacitance of element 128 through the source drain path of FET 122.

If the frequency of clock source 101 is sufficiently high, the voltage at terminal 123 stays high throughout the low voltage half cycle of clock source 101 to prevent a change of state of inverters 124 and 126 so the output voltage of inverter 126 stays high. In such an event, timing circuit 104 supplies a positive +$V_{DD}$ voltage to the non-inverting input terminal of AND gate 106 throughout the low voltage half cycle of clock source 101. Accordingly, in response to a positive going transition at the beginning of the next cycle of clock source 101, the output of gate 106 goes from a positive voltage to ground. The source drain resistance of FET 122 (when on) and capacitance of element 128 are selected, in an embodiment wherein clock 101 has a normal operating frequency of 1 GHz, so that the foregoing operation occurs for low voltage half cycles of clock source 101 having a period of 550 ps. or less. In other words, the foregoing operation occurs for clock sources having an approximately 50% duty cycle and frequencies of 1 GHz or more.

If, however, the period of the low voltage half cycle of source 101 exceeds 550 ps. the write enable output signal of gate 106 has a positive to ground transition 550 ps. after the ground to positive transition thereof. This is because 550 ps. after discharge of the capacitance of element 128 begins, the voltage at terminal 123 drops to a value equal to the predetermined intermediate threshold value which causes inverter 124 to change state so the output of inverter 124 changes from ground to a positive voltage. Inverter 126 responds to the change in voltage at the output terminal of inverter 124 so inverter 126 derives a low, essentially ground voltage. The low voltage output of inverter 126 disables gate 106, causing the output of gate 106 to have a positive to ground transition. The low voltage at the output of gate 106 causes the source drain path of FET 122 to turn off. Consequently, the discharge rate of the voltage stored on the capacitance of element 128 is substantially reduced. The low voltage state at the output of gate 106 remains because terminal 123 cannot be charged by +$V_{DD}$ through the source drain path of FET 120, which remains off in response to the high value of NCK at the gate electrode of FET 120. Hence, the high voltage output of gate 106 is limited to a period of no more than 550 ps., regardless of the frequency of clock source 101.

For frequencies of clock source 101 in excess of approximately 1 GHz, the write enable signal that gate 106 derives essentially follows the wave shape of clock 101. This is because FET 122 is never on long enough to cause the voltage at terminal 123, which is controlled by the RC time constant of the on resistance of the source drain path of FET 122 and the capacitance of FET 128, to drop sufficiently to reach the threshold value of inverter 124. Consequently, inverter 126 always supplies a positive input to the non-inverting input of AND gate 106 and the AND gate output is an inverted replica of CLK that source 101 applies to the inverting input of the AND gate.

Figure 2:
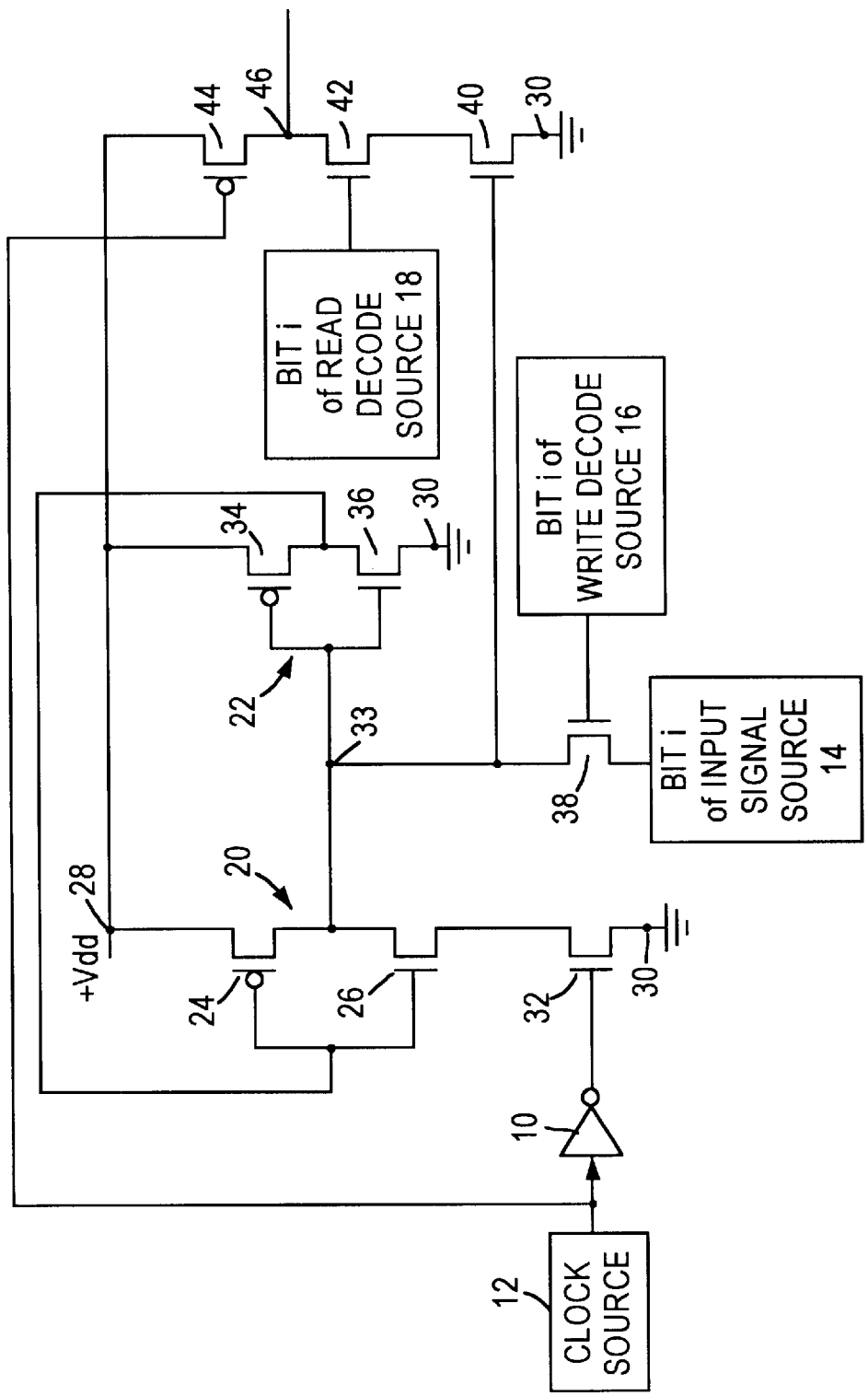
FIG. 2 is a circuit diagram of a cell of the register of FIG. 1.

As mentioned before, the write enable output of AND gate 106 is applied in parallel to cells 0, 1, . . . i . . . (N−1), each of which is constructed the same as in the prior art circuit illustrated in FIG. 2. Thus, the output of gate 106 is applied in parallel via inverting driver 10 to the gate electrode of FET 32 of each of cells 0, 1, . . . i . . . (N−1). The high output of inverter 10 turns on FET 32 of each cell to enable inverter 20 of each of the cells. Each of the cells is thus activated to a storage mode because inverters 20 and 22 are regeneratively connected to each other.

After the cells have been activated into the storage mode for 550 ps. or less, AND gate 106 applies a low voltage to inverting driver 10. Driver 10 responds to the low voltage to apply a high voltage to the gate electrodes of FET 32 to turn off the write mode of each of cells 0, 1, . . . i . . . (N−1), regardless of the frequency of clock 101. Consequently, the write mode of each of cells 1, 2 . . . i . . . (N−1) terminates 550 ps. or less after it began. Because AND gate 106 effectively causes a negative voltage to be applied to the gate of FET 32 for no more than 550 ps. during each cycle of clock 101, regardless of the frequency of the clock, charge accumulation on node 33 though FET 38 does not occur for a long enough period of time to change the value of the cell. Any charge that is accumulated on node 33 while FET 32 is on is removed through FETs 26 and 32 to ground rail node 30.

If cell i stores a zero signal voltage value so the voltage at terminal 33 is substantially zero when AND gate 106 derives a high voltage that causes a low voltage to be applied to the gate electrode of FET 32 while bit i of write decode source 16 applies a low voltage to the gate of FET 38, the voltage at terminal 33 of cell i remains at a zero level even though terminal 33 floats for a short interval. For a 100 MHz clock source driving circuitry designed to normally respond to a 1 GHz clock, the interval while the gate electrode of FET 32 is high is about 9.45 ns. We have found that the voltage of terminal 33 remains low in a floating state for the entire interval that the source drain path of FET 32 has a high impedance.

Read and write operations of cells 1, 2 . . . i . . . (N−1) of FIG. 3 are performed basically in the same manner as described in connection with FIGS. 1 and 2. The binary signal that cell i stores is read during those low voltage half cycles of clock 101 when bit i of read decode source 18 supplies a positive voltage to the gate electrode of FET 42. Cell i is read during the same half cycle of clock 101 that AND gate 106 applies a positive voltage having a maximum duration of 550 ps. to the gate electrode of FET 32.

Bit i of input signal source 14 is applied to terminal 33 through the source drain path of FET 38 during the positive voltage half cycles of source 101, while bit i of write decode source 16 has a positive voltage that turns ON FET 38. To these ends, write decode source 16 and the positive half cycles of clock 101 are synchronized in a manner known to those of ordinary skill in the art.

While there have been described and illustrated a specific embodiment of the invention, it will be clear that variations in the details of the embodiment specifically illustrated and described may be made without departing from the true spirit and scope of the invention as defined in the appended claims.

What is claimed is:

1. An integrated circuit chip adapted to be responsive to a source of clock waves having differing frequencies at different times comprising a bi-level write enable source adapted to be responsive to the clock waves having differing frequencies, a memory cell having a write enable input terminal connected to be responsive to the write enable source, the cell having a tendency to operate improperly in response to the write enable source deriving a first level for an excessively long duration, the write enable signal source being constructed to respond to the clock waves so that (a) for first clock waves having half cycles of duration less than a predetermined duration the write enable source derives the first level for durations approximately equal to the durations of the half cycles of the first clock waves, and (b) for second clock waves having half cycles of duration greater than the predetermined duration the write enable source derives the first level for durations substantially equal to the predetermined duration, the predetermined duration being less than the excessively long duration.

2. The integrated circuit chip of claim 1, wherein the write enable source includes a timing circuit having a resistance capacitance time constant and inputs responsive to a replica of the clock waves and an output of the write enable source.

3. The integrated circuit chip of claim 2, wherein the resistance capacitance time constant is formed by a resistance and capacitance, the timing circuit including first and second complementary field effect transistors having series connected source drain paths, the first field effect transistor being connected to be responsive to the clock waves so that during first half cycles of each of the clock waves the first field effect transistor supplies current from a DC power supply terminal to the resistance and capacitance and during second half cycles of the clock waves the capacitance is decoupled from the DC power supply terminal, the first and second half cycles occurring during the same cycle of the clock waves, the second field effect transistor being connected to be responsive to the write enable source so that (a) during an initial portion of the second half cycles the second field effect transistor discharges the capacitance at a rate determined by the resistance capacitance time constant and (b) during the second half cycles having a duration in excess of the predetermined duration the capacitance remains discharged sufficiently to turn off the write enable signal.

4. The integrated circuit chip of claim 3, wherein the timing circuit includes a gate having first and second inputs respectively responsive to (a) the voltage across the capacitance being greater and not greater than a threshold and (b) a replica of the clock wave, the gate being arranged so that (a) during the first half cycles the voltage across the capacitance and the clock waves cause the write enable signal to have the second level, (b) during the initial portion of the second half cycles the voltage across the capacitance and the clock wave cause the write enable signal to have the first level, and (c) after the second half cycle has elapsed for a time substantially equal to or greater than the predetermined duration the voltage across the capacitance has decreased sufficiently to cause the write enable signal to have the second level.

5. The chip of claim 4 further including a voltage detector connected to be responsive to the voltage across the capacitance for driving the gate first input.

6. The integrated circuit chip of claim 5, wherein the cell includes first and second inverters connected to each other in a back-to-back regenerative circuit, a storage node between the first and second inverters, a field effect transistor having a gate electrode connected to be responsive to the write enable source, the field effect transistor being connected to the first inverter to respectively enable and disable the first inverter in response to the write enable source deriving the first and second levels, the arrangement being such that excessive charge has a tendency to accumulate on the storage node in response to the FET disabling the first inverter for an excessively long time that exceeds the predetermined duration, the storage node having a tendency to respond to the excessive charge to change the state of a voltage stored by the cell.

7. The integrated circuit chip of claim 1, wherein the cell includes first and second inverters connected to each other in a back-to-back regenerative circuit, a storage node between the first and second inverters, a field effect transistor having a gate electrode connected to be responsive to the write enable source, the field effect transistor being connected to the first inverter to respectively enable and disable the first inverter in response to the write enable source deriving the first and second levels, the arrangement being such that excessive charge has a tendency to accumulate on the storage node in response to the FET disabling the first inverter for an excessively long time that exceeds the predetermined duration, the storage node having a tendency to respond to the excessive charge to change the state of a voltage stored by the cell.

8. A method of operating a cell of a semiconductor memory, the cell of the semiconductor memory operating correctly in response to bi-level write enable signals having a first level with a duration less than a predetermined interval and having a tendency to operate incorrectly in response to the first level of the write enable signals having durations greater than the predetermined value, comprising the steps of during a first time interval deriving a first clock wave having half cycles less than the predetermined period, responding to said first clock wave to supply the memory cell with a write enable signal having the first level with a duration substantially equal to the period of the half cycle of the first clock wave, during a second time interval deriving a second clock wave having half cycles with durations in excess of the predetermined duration, and responding to the second clock wave to supply the memory cell with a write enable input signal having the first level with a duration that is no greater than the predetermined duration.

9. The method of claim 8 wherein the duration of the first level of the write enable signal which is derived in response to the second clock wave equals the predetermined duration.

10. The method of claim 8 further comprising during a third time interval deriving a third clock wave having half cycles with durations in excess of the predetermined duration, and responding to the third clock wave to supply the memory cell with a write enable input signal having the first level with a duration that is no greater than the predetermined duration.

11. The method of claim 10 further comprising during a fourth time interval deriving a fourth clock wave having half cycles less than the predetermined period, responding to said fourth clock wave to supply the memory cell with a write enable signal having the first level with a duration substantially equal to the period of the half cycle of the fourth clock wave.

12. The method of claim 8 further comprising during a third time interval deriving a third clock wave having half cycles less than the predetermined period, responding to said third clock wave to supply the memory cell with a write enable signal having the first level with a duration substantially equal to the period of the half cycle of the third clock wave.

\* \* \* \* \*